(12) United States Patent
Chen et al.

(10) Patent No.: US 11,377,752 B2
(45) Date of Patent: Jul. 5, 2022

(54) MONO-CRYSTALLINE SILICON GROWTH METHOD

(71) Applicant: GlobalWafers Co., Ltd., Hsinchu (TW)

(72) Inventors: Chun-Hung Chen, Hsinchu (TW); Hsing-Pang Wang, Hsinchu (TW); Wen-Ching Hsu, Hsinchu (TW); I-Ching Li, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 83 days.

(21) Appl. No.: 16/727,941

(22) Filed: Dec. 27, 2019

(65) Prior Publication Data
US 2020/0208296 A1 Jul. 2, 2020

(30) Foreign Application Priority Data
Dec. 28, 2018 (TW) .................................. 107147827

(51) Int. Cl.
*C30B 15/14* (2006.01)
*C30B 15/00* (2006.01)
*C30B 15/20* (2006.01)
*C30B 29/06* (2006.01)

(52) U.S. Cl.
CPC ............ *C30B 15/14* (2013.01); *C30B 15/002* (2013.01); *C30B 15/203* (2013.01); *C30B 29/06* (2013.01)

(58) Field of Classification Search
CPC ..... C30B 15/002; C30B 15/14; C30B 15/203; C30B 15/22; C30B 29/06
See application file for complete search history.

(56) References Cited

U.S. PATENT DOCUMENTS

| 4,874,458 | A | 10/1989 | Nishizawa | |
| 6,514,335 | B1* | 2/2003 | Egashira | ................. C30B 29/06 117/13 |
| 2005/0252441 | A1* | 11/2005 | Sakurada | ................ C30B 15/14 117/13 |
| 2009/0235861 | A1* | 9/2009 | Fujiwara | ................. C30B 29/06 117/21 |
| 2015/0017086 | A1* | 1/2015 | Nagai | ..................... H01L 29/16 423/348 |

FOREIGN PATENT DOCUMENTS

| CN | 101148777 A | 3/2008 |
| CN | 101175872 A | 5/2008 |
| CN | 102877117 A | 1/2013 |
| CN | 103556223 A | 2/2014 |
| CN | 106414815 A | 2/2017 |
| CN | 106574391 A | 4/2017 |
| JP | 2001261482 A | 9/2001 |
| JP | 2013006758 A * | 1/2013 |
| TW | 201005132 A1 | 2/2010 |

\* cited by examiner

*Primary Examiner* — Hua Qi
(74) *Attorney, Agent, or Firm* — Li & Cai Intellectual Property Office

(57) ABSTRACT

A mono-crystalline silicon growth method includes: providing a furnace, a supporting base and a crucible which do not rotate relative to the furnace, and a heating module disposed at an outer periphery of the supporting base. After solidifying a liquid surface of a silicon melt in the crucible to form a crystal, the heating power of the heating module is successively reduced to appropriately adjust the temperature around the crucible to effectively control a temperature gradient of a thermal field around the crucible, so as to form a mono-crystalline silicon ingot by solidifying the silicon melt.

5 Claims, 10 Drawing Sheets

MONO-CRYSTALLINE SILICON GROWTH METHOD

CROSS-REFERENCE TO RELATED PATENT APPLICATION

This application claims the benefit of priority to Taiwan Patent Application No. 107147827, filed on Dec. 28, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a crystal growth method, and more particularly to a mono-crystalline silicon growth method.

BACKGROUND OF THE DISCLOSURE

A conventional silicon growth apparatus is configured to heat to melt a solid raw material and solidify to crystallize the melted raw material to form a crystal rod. In addition, because the Czochralski Method (i.e., CZ method) is the primary method used in a conventional process to manufacture a crystal rod, conventional mono-crystalline silicon growth methods are also limited thereto. As a result, development in this field has been limited, and still has room for improvement.

SUMMARY OF THE DISCLOSURE

In response to the above-referenced technical inadequacies, the present disclosure provides a mono-crystalline silicon growth method to improve on issues associated with obstacles against development in this field.

In one aspect, the present disclosure provides a mono-crystalline silicon growth method including a preparation step, an initiation step, a shoulder-forming step, a body-forming step, and a tail-forming step. The preparation step is implemented by disposing a silicon melt in a crucible of a mono-crystalline silicon growth apparatus, wherein the mono-crystalline silicon growth apparatus includes a support base supporting the crucible and a heating module disposed at an outer periphery of the support base, and the support base and the crucible do not rotate relative to the heating module. The initiation step is implemented by solidifying a liquid surface of the silicon melt to form a crystal and horizontally growing the crystal toward a side wall of the crucible to increase an outer diameter of the crystal. The shoulder-forming step is implemented by adjusting a thermal field around the crucible when the outer diameter of the crystal reaches at least 90% of a predetermined value so that the outer diameter of the crystal reaches the predetermined value and the crystal is defined as a head crystal, and vertically growing the head crystal toward an inner bottom surface of the crucible. The body-forming step is implemented by reducing a total heat output of the heating module so that the head crystal continuously crystallizes to form a first stage crystal, continuously reducing the total heat output of the heating module so that the first stage crystal continuously crystallizes to form a second stage crystal, and reducing the total heat output of the heating module again so that the second stage crystal continuously crystallizes to form a third stage crystal. The tail-forming step is implemented by reducing the total heat output of the heating module so that the third stage crystal continuously crystallizes to form a tail crystal, and detaching the tail crystal from the crucible to form a mono-crystalline silicon ingot by solidifying the silicon melt.

In one aspect, the present disclosure provides a mono-crystalline silicon growth apparatus including a furnace, a support base disposed in the furnace, a crucible disposed on the support base, and a heating module disposed at an outer periphery of the support base. The support base and the crucible do not rotate relative to the heating module, and an axial direction is defined to be along a central axis of the crucible. The heating module includes a first heating unit, a second heating unit, and a third heating unit. The first heating unit, the second heating unit, and the third heating unit are respectively disposed at positions with different heights corresponding to the axial direction.

Therefore, the mono-crystalline silicon growth method of the present disclosure is provided. The mono-crystalline silicon growth apparatus includes the support base and the crucible which do not rotate relative to the furnace. The heating module can effectively and appropriately adjust a temperature around the crucible to effectively control a directional solidification of a seed crystal and a crystal growth in a crystal growth process of the mono-crystalline silicon ingot so as to improve crystal growth effect. As a result, a quality of the mono-crystalline silicon ingot is improved. Therefore, by using the mono-crystalline silicon growth method, a usage rate of the crystal rod and a production yield are increased.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
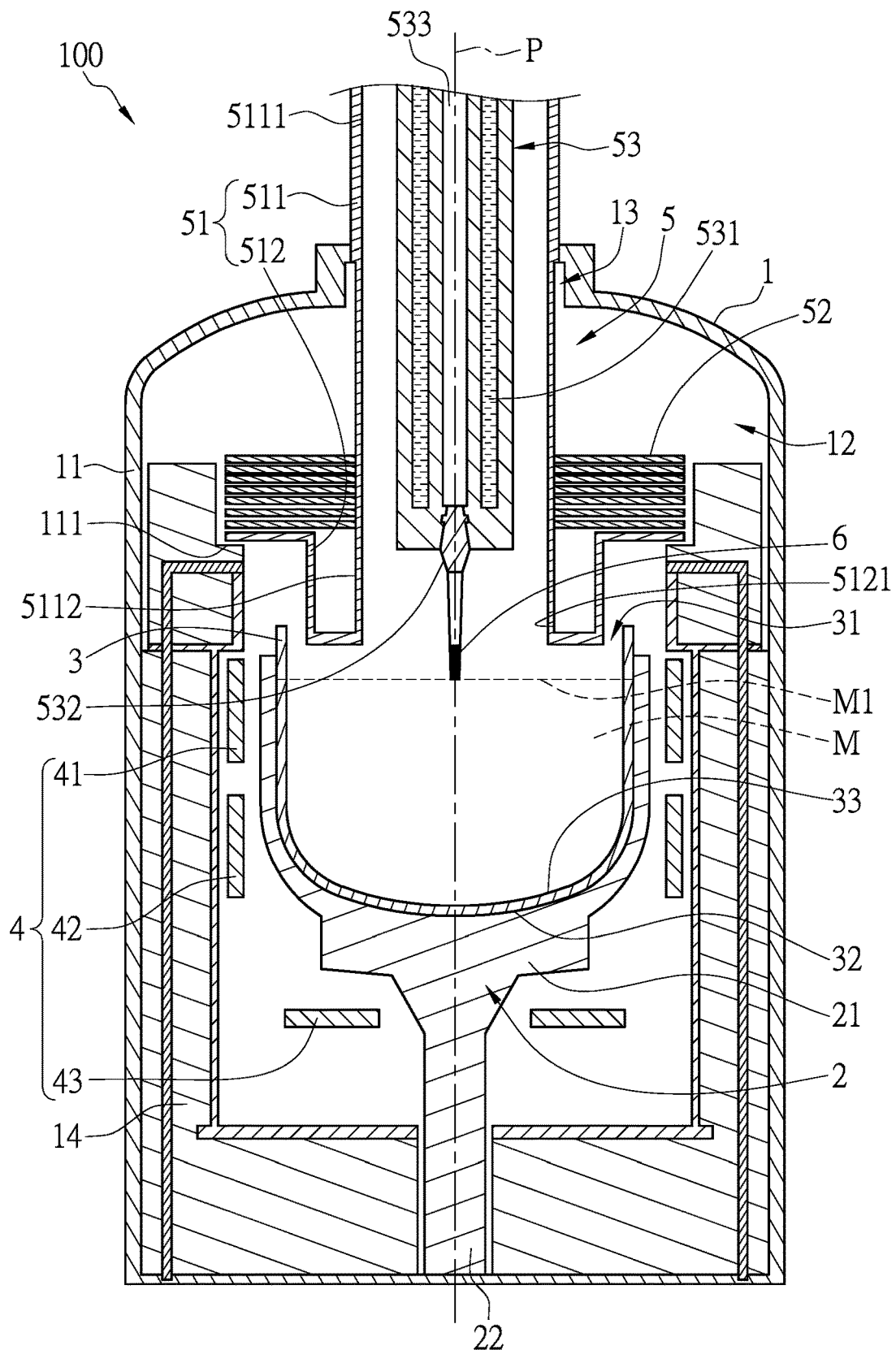
FIG. 1 is a sectional view of a mono-crystalline silicon growth apparatus of the present disclosure according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Mono-Crystalline Silicon Growth Apparatus

Figure 2:
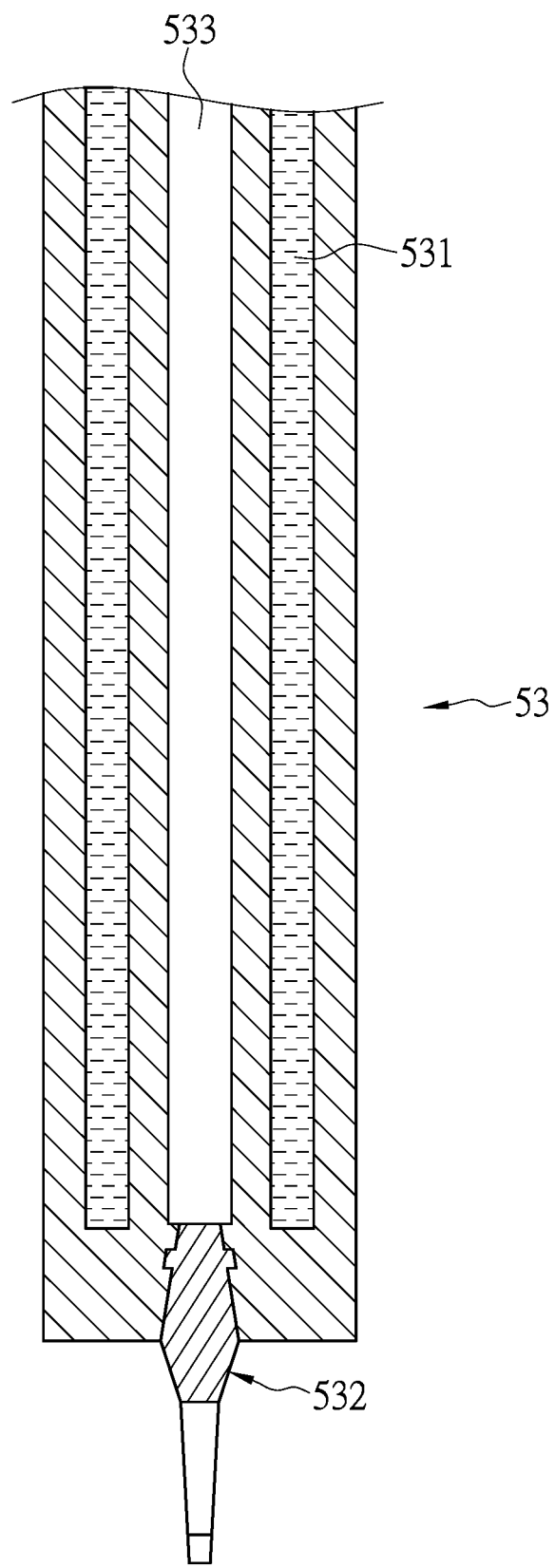
FIG. 2 is a partial enlarged view of a hard shaft in FIG. 1.
Figure 3:
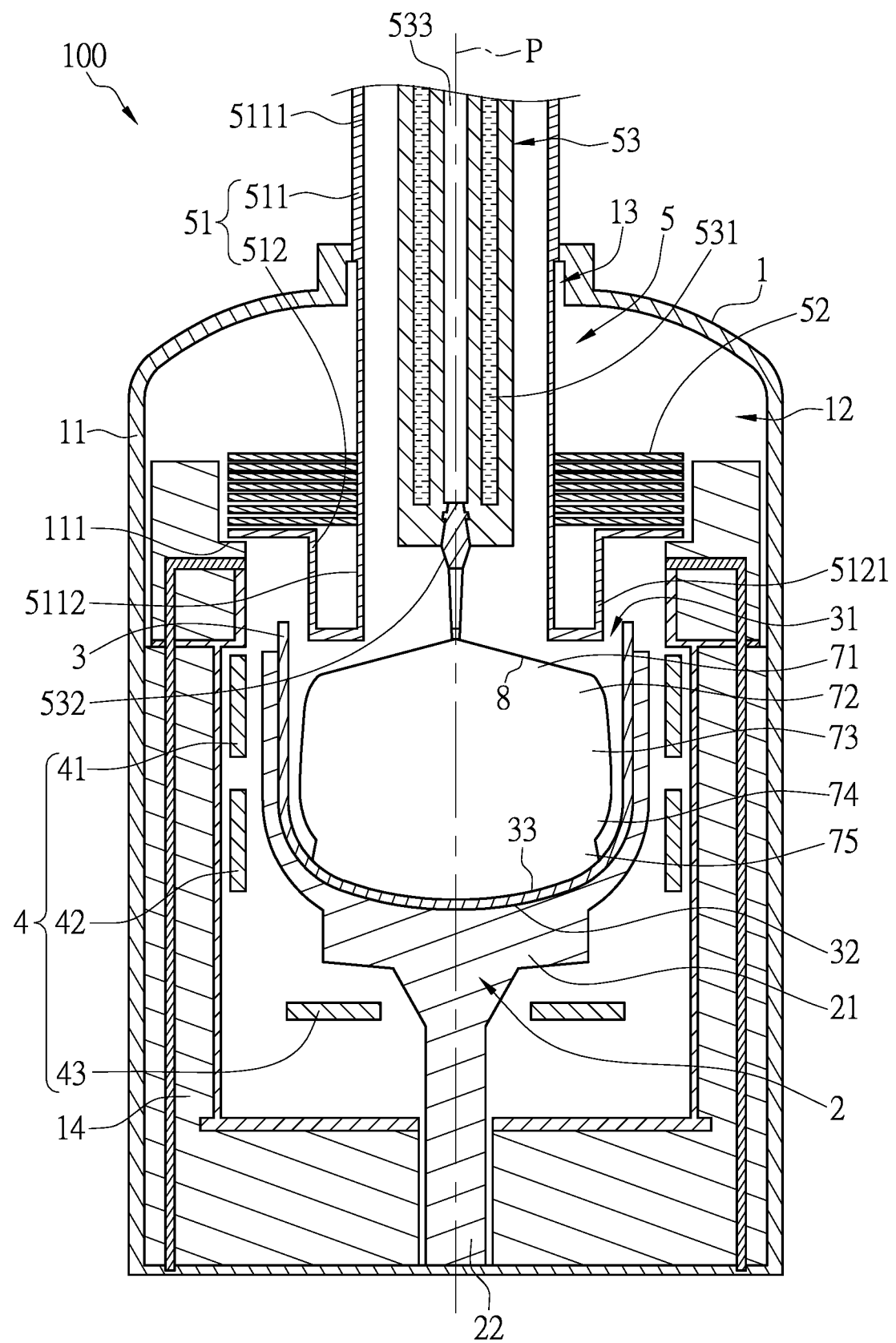
FIG. 3 is a schematic diagram of the mono-crystalline silicon growth apparatus forming a mono-crystalline silicon ingot according to the embodiment of the present disclosure.

Referring to FIG. 1 to FIG. 3, an embodiment of the present disclosure provides a mono-crystalline silicon growth apparatus 100 including a furnace 1, a support base 2 disposed in the furnace 1, a crucible 3 disposed on the support base 2, a heating module 4 disposed at an outer periphery of the support base 2, and a heat adjusting module 5 disposed in the furnace 1 and above the crucible 3.

It should be noted that the heat adjusting module 5 in the present embodiment can cooperate with corresponding components mentioned above, but the connection between the heat adjusting module 5 and the corresponding components is not limited thereto. That is to say, in other embodiments of the present disclosure, the heat adjusting module 5 can be used independently or with other components. In addition, the furnace 1, the support base 2, the crucible 3, and the heating module 4 can further cooperate with a component different from the heat adjusting module 5 in the present embodiment.

The furnace 1 includes a furnace wall 11 which is substantially in a barrel shape and a heat preservation layer 14 inside of the furnace 1. The furnace wall 11 surroundingly forms an accommodating space 12 within, and the heat preservation layer 14 is in the accommodating space 12 so as to maintain a temperature inside the furnace 1 so that the quality of a crystal rod in the furnace 1 in a crystal growth process can be ensured.

In addition, a top side of the furnace 1 has a valve port 13 in spatial communication with the accommodating space 12 so that the accommodating space 12 can be in spatial communication with the external environment through the valve port 13. The furnace 1 has a mounting groove 111 which is annular and at an appropriate height inside of the furnace 1, and the mounting groove 111 in the present embodiment is at a top side of the heat preservation layer 14, but the present disclosure is not limited thereto.

The support base 2 is preferably made of a graphite material, but the present embodiment is not limited thereto. The support base 2 is disposed in the heat preservation layer 14 of the furnace 1, the support base 2 includes a carrying portion 21 in a bowl shape and a support portion 22 in a pillar shape, and a top side of the support portion 22 is connected to a bottom side of the carrying portion 21.

The crucible 3 can be made of a quartz material, but the present embodiment is not limited thereto. The crucible 3 is disposed in the heat preservation layer 14 of the furnace 1, and the crucible 3 is disposed in the carrying portion 21 of the support base 2. In addition, in the present embodiment, an outer surface of the crucible 3 abuts against an inner surface of the carrying portion 21, and a top side of the crucible 3 slightly extends out of the carrying portion 21 in the bowl shape, but the present embodiment is not limited thereto. The crucible 3 has a crucible opening 31 at the top side of the crucible 3, and the crucible opening 31 faces toward the valve opening 13 to be filled with a melt liquid for being heated. In the present embodiment, the melt liquid is a silicon melt M.

Therefore, because the crucible 3 softens and deforms easily under a high temperature, the support base 2 can provide the crucible 3 with a sufficient supporting force to prevent the crucible 3 from tilting. Moreover, the support base 2 and the crucible 3 in the present embodiment are limited to not rotate relative to the furnace 1. That is to say, any support bases or crucibles rotating relative to the furnace are neither the support base 2 nor the crucible 3 in the present embodiment.

It should be noted that the furnace 1 is defined to have a central axis P, and the valve opening 13, the supporting base 2, and the crucible 3 are all mirror-symmetrical relative to the central axis P.

The heating module 4 is disposed in the heat preservation layer 14 of the furnace 1 and is disposed at the outer periphery of the support base 2. The heating module 4 includes a first heating unit 41, a second heating unit 42, and a third heating unit 43. The first heating unit 41, the second heating unit 42, and the third heating unit 43 are respectively disposed corresponding to the axial direction and at positions with different heights of the support base 2.

In the present embodiment, the first heating unit 41 surrounds and faces toward an upper half of the crucible 3, the second heating unit 42 surrounds and faces toward a lower half of the crucible 3 and is disposed under the first heating unit 41, the third heating unit 43 is disposed under the crucible, and a projection area formed by orthogonally projecting the third heating unit 43 onto the crucible 3 along the central axis P (or a axial direction of a tube body 511 mentioned below) falls on an outer bottom surface 32 of the crucible 3, but the present disclosure is not limited thereto. The upper half of the crucible 3 in the present embodiment refers to a portion extending from the crucible opening 31 downward to 50% of a depth of the crucible 3, and the lower half of the crucible 3 refers to a portion extending from the inner bottom surface 33 upward to 50% of the depth of the crucible 3, but the present disclosure is not limited thereto.

Moreover, the first heating unit 41, the second heating unit 42, and the third heating unit 43 can be designed to be an annular heating device or a plurality of heating devices arranged annularly, but the present disclosure is not limited thereto.

The heat adjusting device 5 is disposed in the furnace 1 and above the crucible 3. The heat adjusting device 5 includes a diversion tube 51, a plurality of heat preservation sheets 52 disposed on the diversion tube 51, and a hard shaft 53 passing through the diversion tube 51. It should be noted that the in the present embodiment, the hard shaft 53 cooperates with the diversion tube 51 and the heat preservation sheets 52, but the connection between the hard shaft 53 and the diversion tube 51 and the connection between the hard shaft 53 and the heat preservation sheets 52 is not limited in the present disclosure. That is to say, in other embodiments of the present disclosure, the hard shaft 53 can be used independently or with other components.

The diversion tube 51 includes a tube body 511 and a carrying body 512. The carrying body 512 is disposed on the mounting groove 111 of the heat preservation layer 14 in the furnace 1, and the carrying body 512 is annular and has an inner hole 5121. One end (e.g., a top portion 5111 of the tube body 511 in FIG. 1) of the tube body 511 is disposed on the furnace 1 and extends out of the valve opening 13, and the other end (e.g., a bottom portion 5112 of the tube body 511 in FIG. 1) of the tube body 511 is connected to a side wall of the inner hole 5121 of the carrying body 512. Moreover, the carrying body 512 surrounds the tube body 511, and the tube body 511 and the carrying body 512 are both above the crucible 3.

In addition, the tube body 511 of the diversion tube 51 and the carrying body 512 of the diversion tube 51 cooperatively define a central axis, and the central axis is preferably substantially overlapping with the central axis P. That is to say, an axial direction of the tube body 511 is parallel to the central axis P. Therefore, a projection area formed by orthogonally projecting the tube body 511 onto the crucible 3 along the axial direction of the tube body 511 falls on the inner bottom surface 33 of the crucible 3. Moreover, the tube body 511 is made of a material which does not react with crystal growth gas, which is generally stainless steel, but the present disclosure is not limited thereto.

In the present embodiment, the heat preservation sheets 52 are preferably in an annular shape and sleeved around the tube body 511. That is to say, the heat preservation sheets 52 are stacked and disposed on the carrying body 512 and sleeved around the tube body 511, but the present disclosure does not limit the shapes of the heat preservation sheets 52. Each of the heat preservation sheets 52 has a thermal radiation reflective rate greater than or equal to 70%. Moreover, the heat preservation sheets 52 allow only less than 10% of heat at one side of the heat preservation sheets 52 to pass through the heat preservation sheets 52 to another side of the heat preservation sheets 52.

More specifically, a number of the heat preservation sheets 52 of the heat adjusting module 5 is seven, but in other embodiments of the present disclosure, the number of the heat preservation sheets 52 of the heat adjusting module 5 is greater than or equal to three. The heat preservation sheets 52 are made of molybdenum, but the present disclosure is not limited thereto.

Moreover, the heat preservation sheets 52 have a function of reflecting thermal radiation and can reflect heat into the crucible 3. In addition, the bottom portion 5112 of the tube body 511 is connected to the inner hole 5121 of the carrying body 512, and the heat preservation sheets 52 are stacked and disposed on the carrying body 512 so that the carrying body 512 and the heat preservation sheets 52 are outside of the tube body 511. The carrying body 512 is disposed on the mounting groove 111 so that the tube body 511, the carrying body 512, and the heat preservation sheets 52 are disposed above the crucible 3, further forming an obstruction above the heat preservation layer 14 to effectively control the heat dissipating through a top side of the heat preservation layer 14.

The hard shaft 53 is in a strip shape and passes through the tube body 511 (as shown in FIG. 1 and FIG. 2), and the hard shaft 53 does not rotate relative to the furnace 1. A water flow channel 531, a gas flow channel 533, and a clamping portion 532 disposed at a bottom side of the hard shaft 53 are disposed in the hard shaft 53.

Both the water flow channel 531 and the gas flow channel 533 can be injected with a fluid to take away the heat near the clamping portion 532 mentioned below. In the present embodiment, the water flow channel 531 can be injected with flowing water and the gas flow channel 533 can be injected with flowing gas, but the present disclosure is not limited thereto. In addition, the water flow channel 531 preferably spirals surroundingly around the gas flow channel 533 to provide the hard shaft 53 with a better cooling effect, but the configuration relationship between the water flow channel 531 and the gas glow channel 533 is not limited thereto in the present disclosure.

The clamping portion 532 is disposed at the bottom side of the hard shaft 53, and at least a part of the clamping portion 532 is disposed in the crucible 3 to clamp a seed crystal 6. In the present embodiment, the clamping portion 532 is adjacent to the water flow channel 531 and the gas flow channel 533 so that the fluid injected into the water flow channel 531 and the gas flow channel 533 can take away the heat near the clamping portion 532.

In addition, the hard shaft 53 can move back and forth along the axial direction of the tube body 511 with a pulling speed preferably less than or equal to 50 mm/hr. When the hard shaft 53 is moving, the clamping portion 532 thereof is maintained in the crucible 3 and moves correspondingly. The pulling speed of the hard shaft 53 can be changed according to the requirements of the crystal growth, and the present disclosure is not limited thereto.

Therefore, the fluid injected into the water flow channel 531 and the gas flow channel 533 can take away the heat near the clamping portion 532 so as to prevent the clamping portion 532 from being influenced by the heat of the silicon melt M in the crucible 3, can control the heat in the crucible 3 effectively, and can stabilize a heat convection in the crucible 3 to maintain a degree of flatness of solidification between a crystal 7 and the silicon melt M.

It should be noted that the gas flow channel 533 of the hard shaft 53 in the present embodiment can be omitted. That is to say, in another embodiment of the present disclosure, only the water flow channel 531 and the clamping portion 532 at the bottom side of the hard shaft 53 are disposed in the hard shaft 53, and the clamping portion 532 is adjacent to the water flow channel 531 so that the fluid injected into the water flow channel 531 can take away the heat near the clamping portion 532.

Referring to FIG. 1 to FIG. 3, the mono-crystalline silicon growth apparatus 100 in the present embodiment takes advantages of the structural design of the heat adjusting module 5 and the configuration relationship between the heat adjusting module 5 and other components, (e.g., the heat preservation layer 14 of the furnace 1, the crucible 3, and the heating module 4). That is to say, the pulling speed and the quality of forming the crystal 7 can be improved through the addition of the hard shaft 53, where the fluid in the water flow channel 531 and/or the gas flow channel 533 takes away the heat of surface solidification during the growth of the crystal 7 and the heat conducting from inside of the silicon melt M to the crystal 7. Therefore, a directional solidification and a crystallization process of the seed crystal 6 melted near the clamping portion 532 can be effectively controlled so that the seed crystal 6 can preferably form the crystal 7.

According to the above, the first heating unit 41, the second heating unit 42, and the third heating unit 43 of the heating module 4 are disposed at an outer periphery of the crucible 3. Therefore, the heating module 4 can provide appropriate heating in the process of forming a mono-crystalline silicon ingot 8 to effectively control the growth speed and the growth quality of the mono-crystalline silicon ingot 8.

Mono-Crystalline Silicon Growth Method

Figure 4:
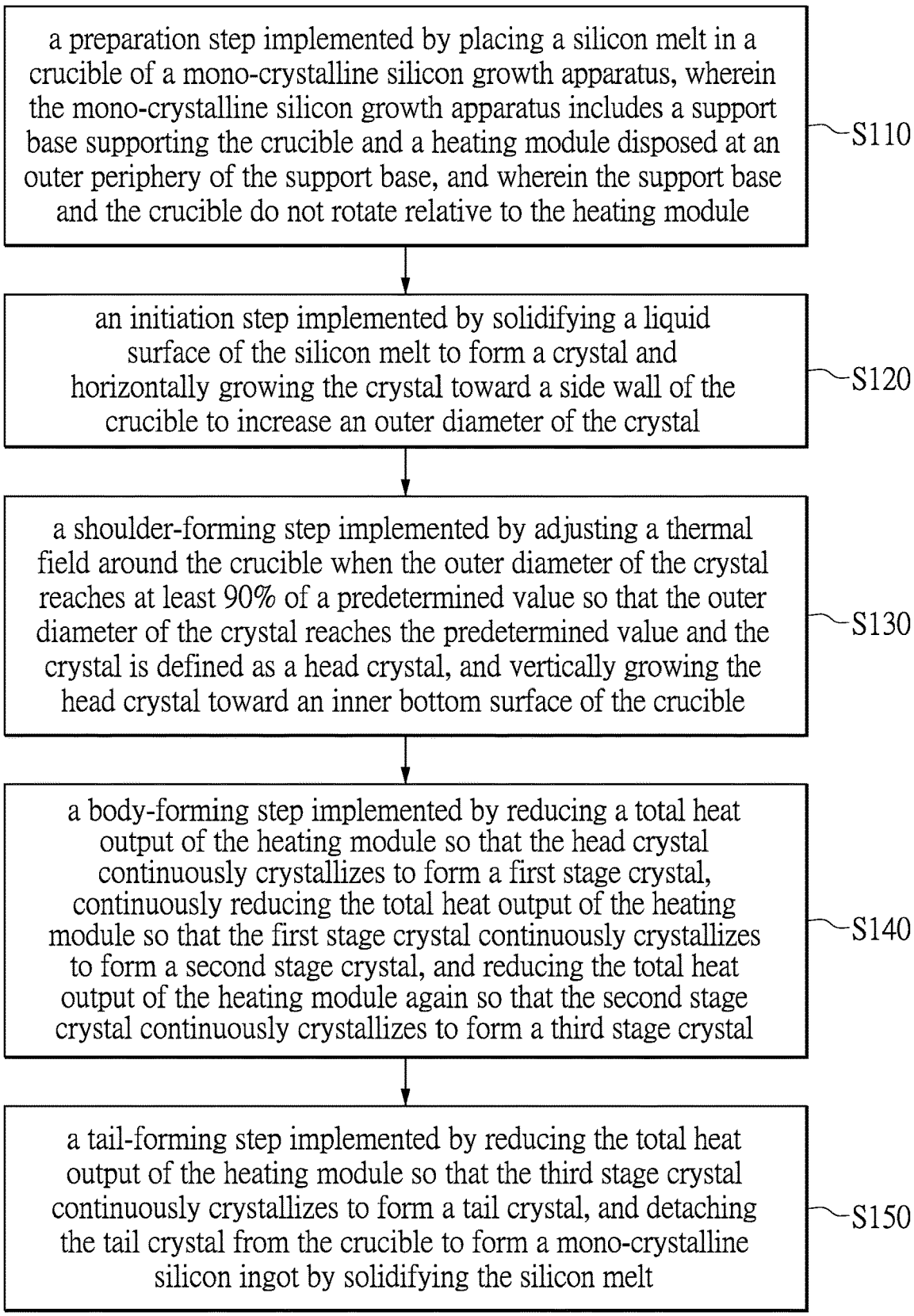
FIG. 4 is a flowchart of a mono-crystalline silicon growth method of the present disclosure according to the embodiment of the present disclosure.
Figure 5A:
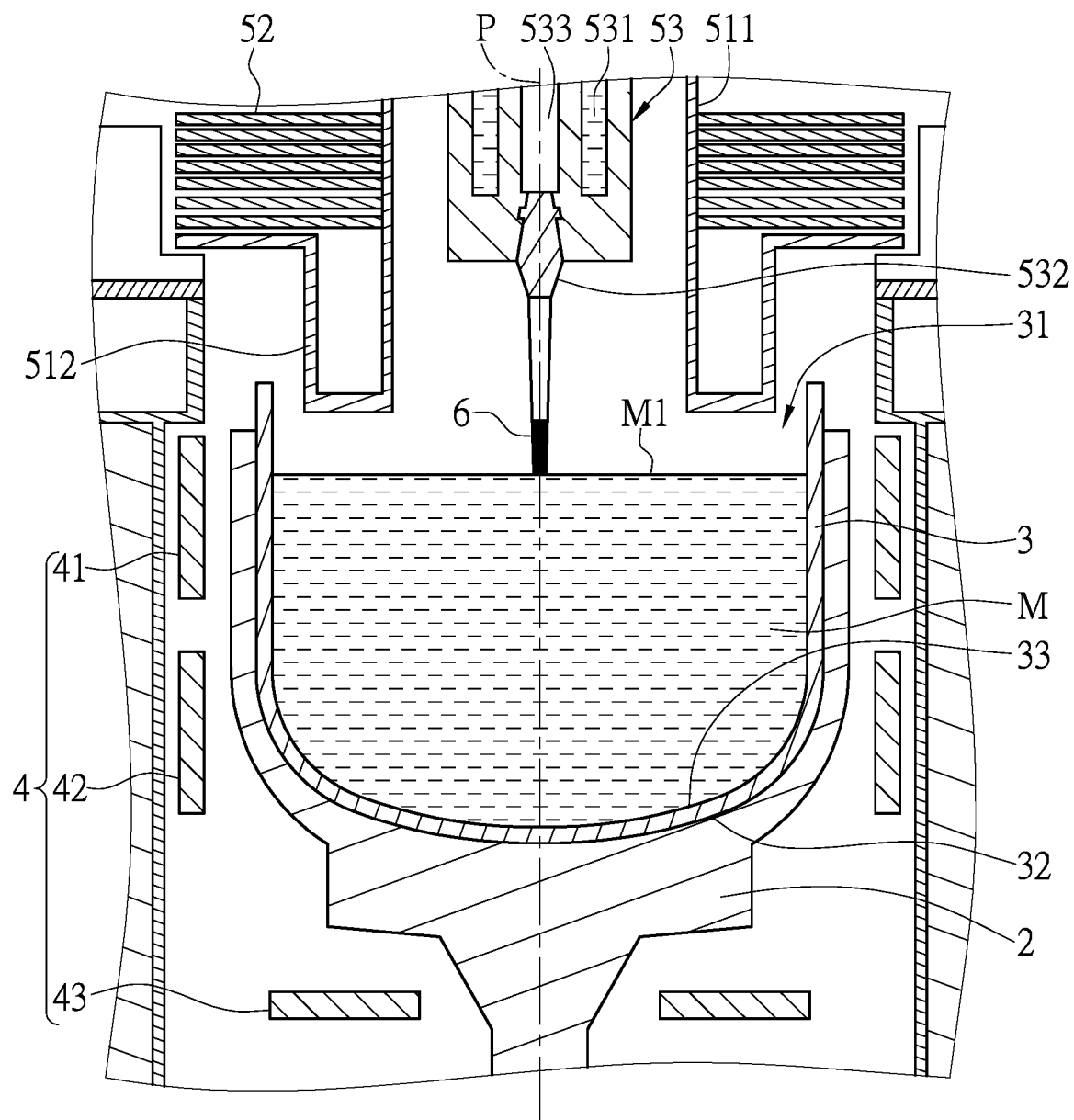
FIG. 5A to FIG. 5F are schematic diagrams of the mono-crystalline silicon growth method of the present disclosure according to the embodiment of the present disclosure.
Figure 5B:
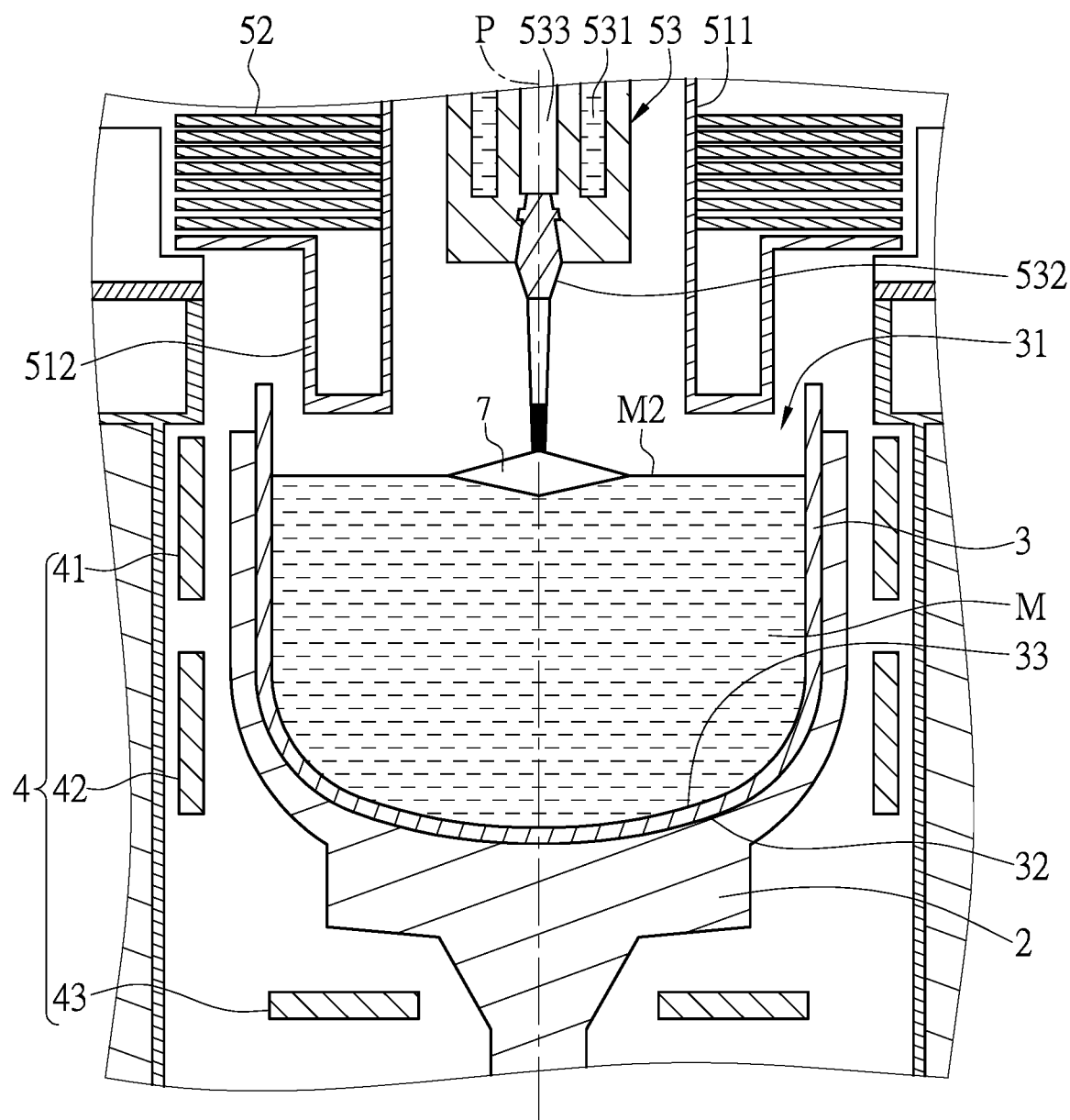
Figure 5C:
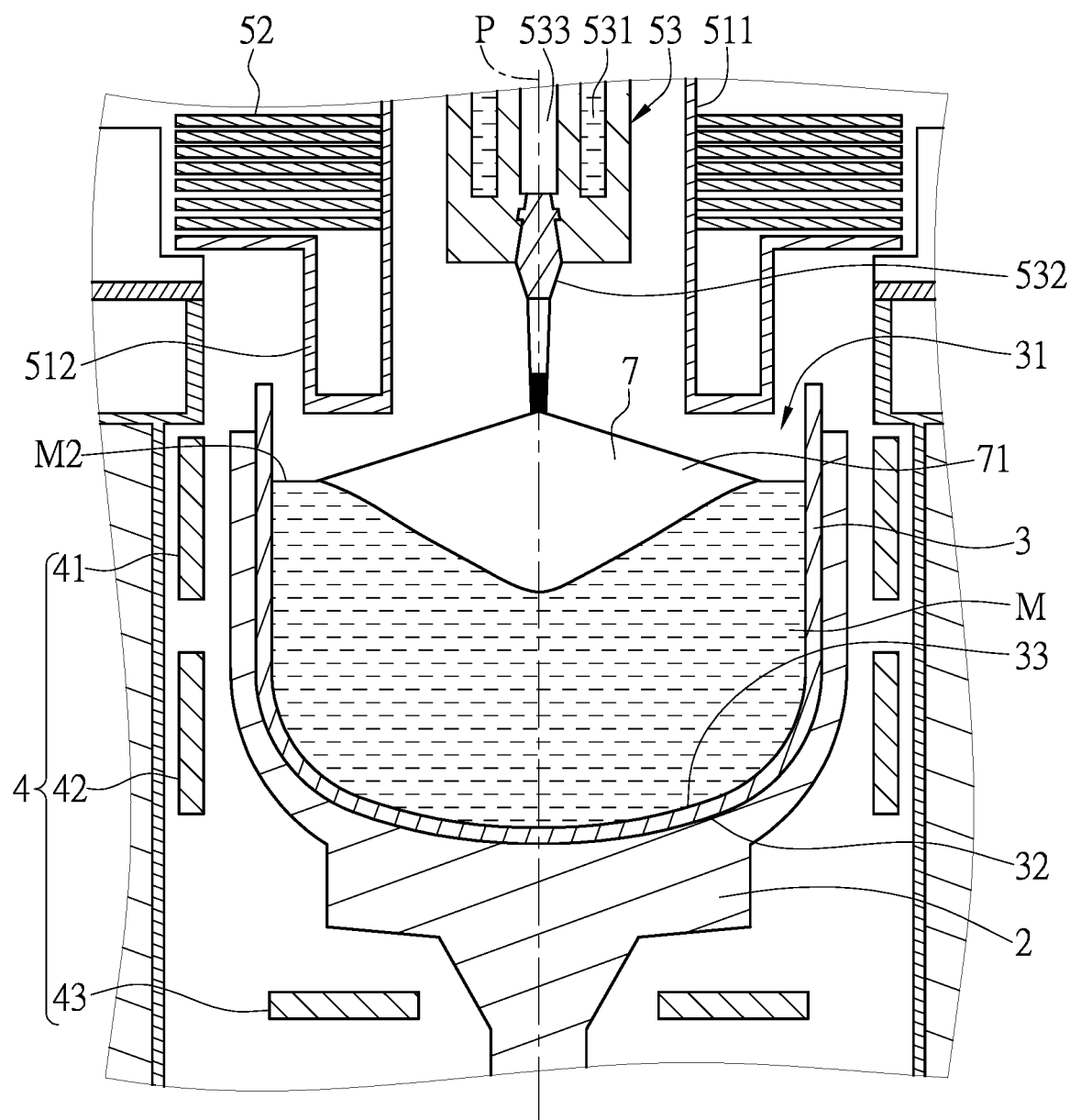
Figure 5D:
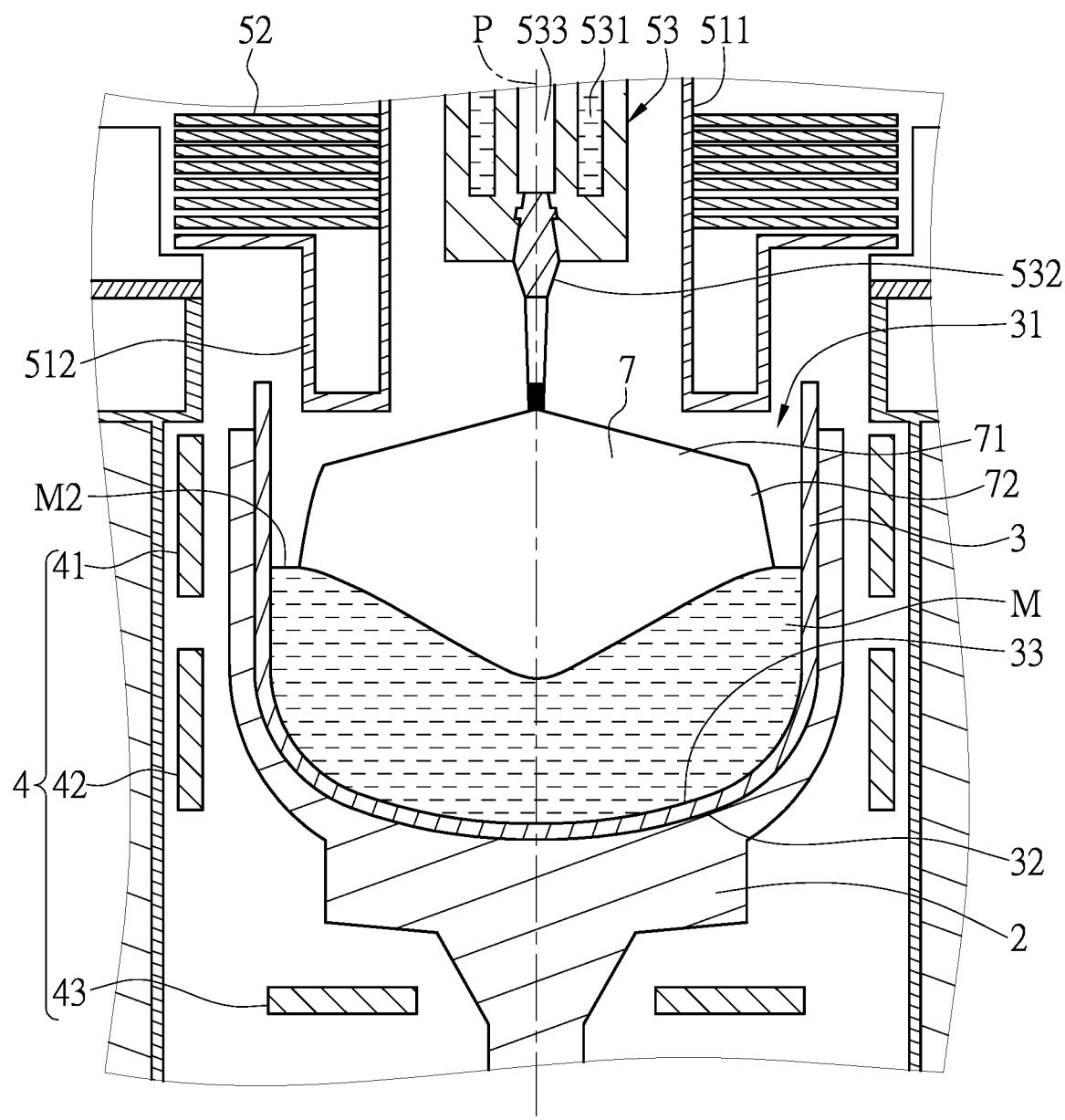
Figure 5E:
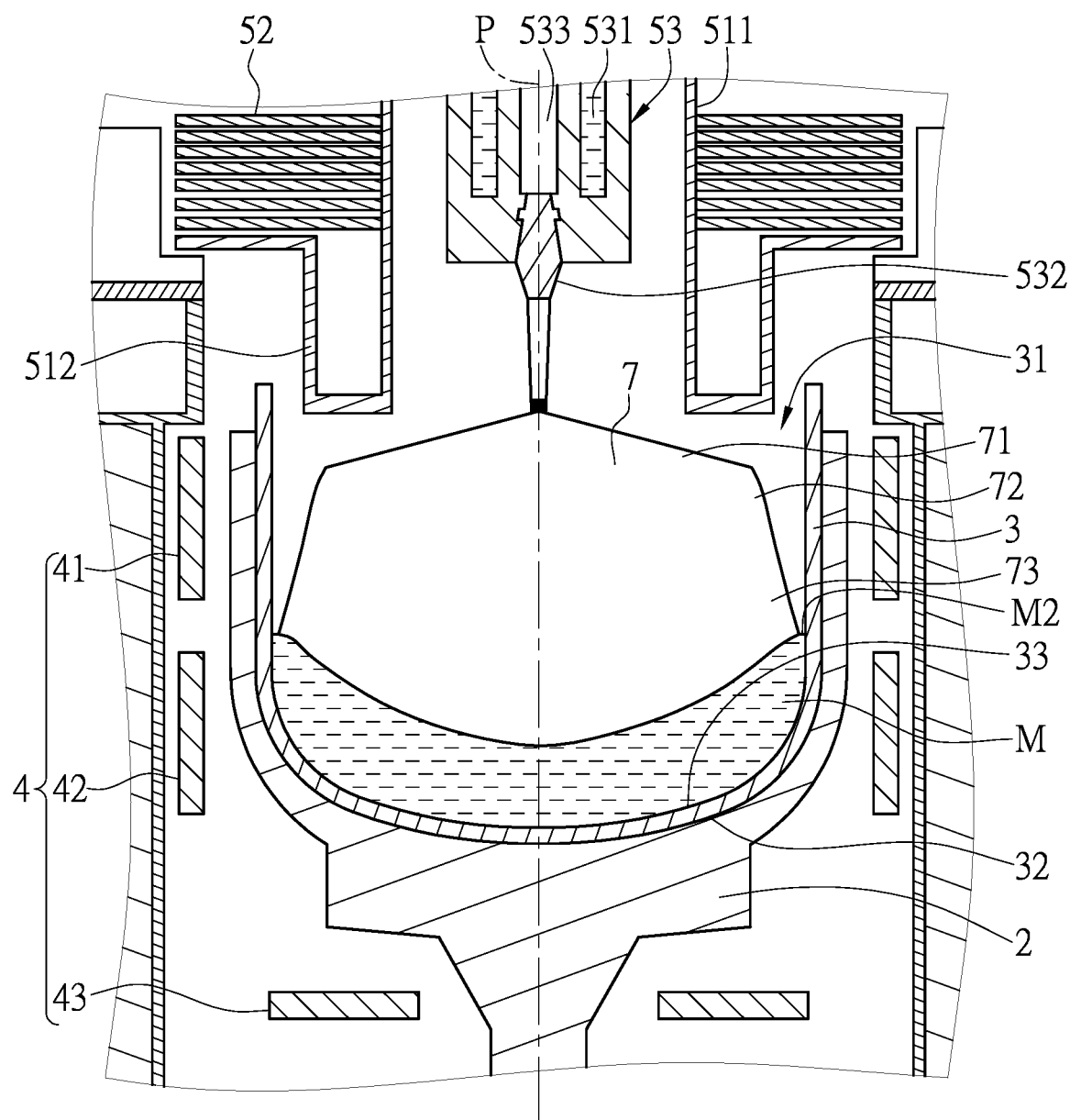
Figure 5F:
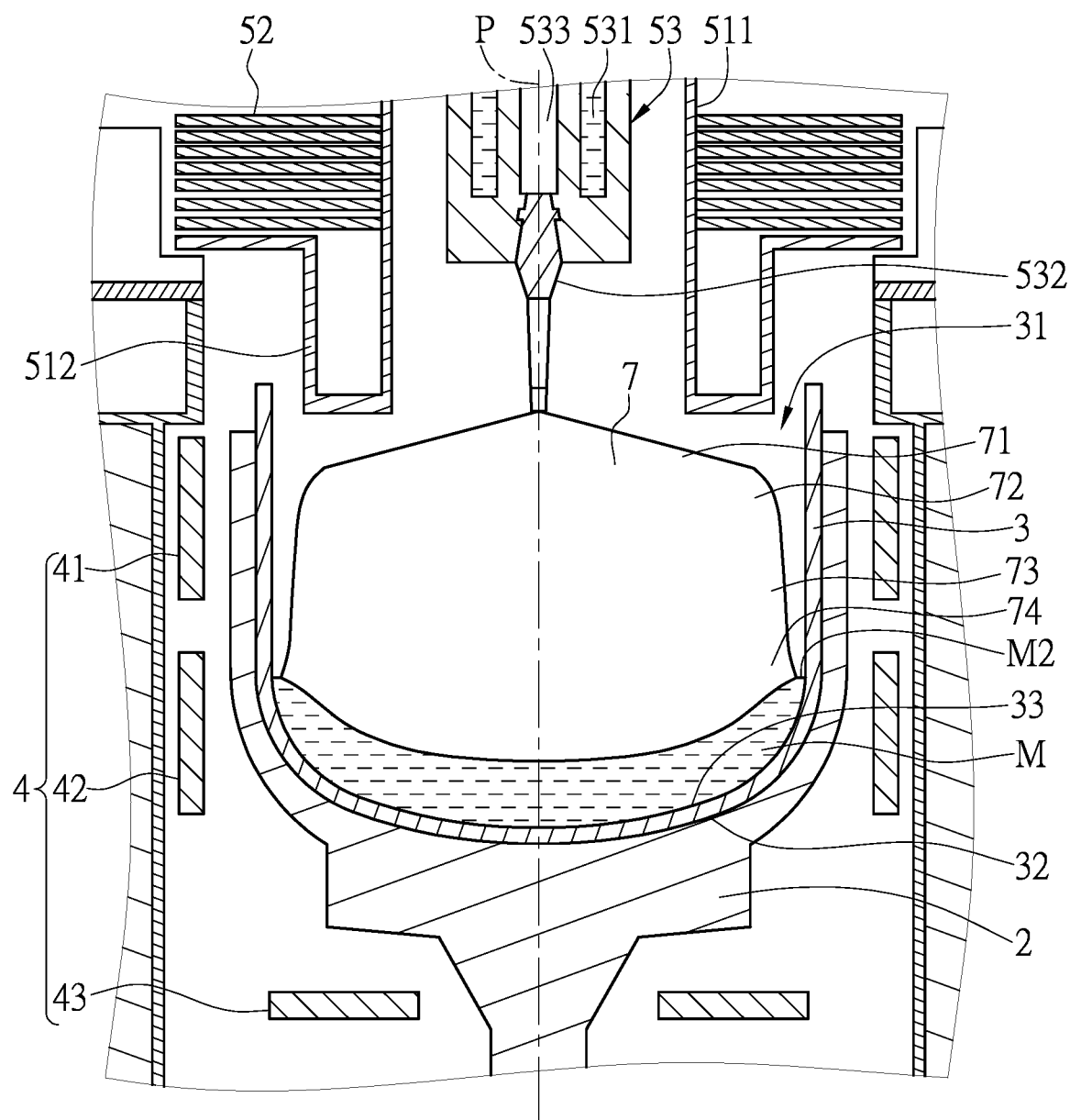

Referring to FIG. 4 to FIG. 5F, the present disclosure further provides a mono-crystalline silicon growth method which can be implemented through the mono-crystalline silicon growth apparatus 100, but the present disclosure is not limited thereto. The mono-crystalline silicon growth method in the present disclosure includes a preparation step S110, an initiation step S120, a shoulder-forming step S130, a body-forming step S140, and a tail-forming step S150.

The preparation step S110 is implemented by providing the mono-crystalline silicon growth apparatus 100 mentioned above and disposing the silicon melt M (as shown in FIG. 5A) in the crucible 3 of the mono-crystalline silicon growth apparatus 100. The specific structure of the mono-crystalline silicon growth apparatus 100 is already described above and will not be reiterated herein. In addition, in other embodiments of the present disclosure, in the mono-crystalline silicon growth apparatus 100 used for the mono-crystalline silicon growth method, the heat adjusting module 5 can be replaced by other components.

That is to say, in the preparation step S110, a stacking charge is placed in the crucible 3, the crucible 3 is heated to form a meltdown by the heating module 4 of the furnace 1, and the meltdown forms the silicon melt M after the heating module 4 appropriately heats the crucible 3. The silicon melt M can be formed by an established method, and will not be reiterated herein.

The initiation step S120 is implemented by solidifying a liquid surface M1 of the silicon melt M to form a crystal 7 and horizontally growing the crystal 7 toward a side wall of the crucible 3 to increase an outer diameter of the crystal 7.

That is to say, as shown in FIG. 5A to FIG. 5C, the seed crystal 6 is disposed near the clamping portion 532 of the hard shaft 53 and contacts with the liquid surface M1 of the silicon melt M. A heat output of the heating module 4 is continuously controlled and enables the liquid surface M1 of the silicon melt M to solidify to form a solid-liquid interface M2. The heat near the clamping portion 532 is taken away by appropriately injecting the fluid into the water flow channel 531 and/or the gas flow channel 533 of the hard shaft 53, and as a result, the crystal 7 having the same crystal structure as that of the seed crystal 6 starts to form on the seed crystal 6 and the solid-liquid interface M2 of the silicon melt M. Moreover, a solidification and crystallization process includes a neck growth process and a crown growth process.

In the neck growth process, a thermal stress generated by the contact between the seed crystal 6 and the solid-liquid interface M2 of the silicon melt M causes dislocations. When a crown starts to grow, the dislocations disappear (as shown in FIG. 5B). In addition, in the neck growth process, the seed crystal 6 is pulled upward rapidly so that a diameter of the crystal 7 during forming decreases to 4 to 6 mm. More specifically, in the neck growth process, the dislocations fully disappear through a pulling technique alternating between fast and slow speeds, which is implemented by fast pulling (e.g., with a fast pulling speed within a range of 120 to 200 mm/hr) to decrease a diameter of the neck and slowly pulling (e.g., with a slow pulling speed within a range of 40 to 100 mm/hr) to increase the diameter of the neck. The pulling technique alternating between fast and slow speeds is implemented many times so that the dislocations fully disappear.

In the crown growth process, a pulling speed and a temperature are decreased after the neck is formed so that the diameter of the crystal 7 is increased gradually to a required size and the crown starts to form (as shown in FIG. 5C). A diameter increasing rate (i.e., an angle of the crown) is the most important factor in this process. If the temperature is decreased too fast, the shape of the crown becomes rectangular because the diameter increases too fast, resulting in the dislocations to occur and therefore losing the crystal structure. Moreover, in the crown growth process, the pulling technique alternating between fast and slow speeds can be used to increase a diameter of the crown with the slow pulling speed (such as within a range of 20 to 40 mm/hr). Meanwhile, because a temperature gradient of a thermal field of the crucible 3 is small, the heating power of the heating module 4 should be reduced carefully to effectively control the heat gradient of the thermal field.

It should be noted that in the starting process, the heat output of the first heating unit 41 is preferably from 80% to 120% of the heat output of the second heating unit 42, and the heat output of the second heating unit 42 is preferably from 80% to 120% of the heat output of the third heating unit 43.

The shoulder-forming process is implemented by adjusting the thermal field around the crucible 3 when the outer diameter of the crystal 7 reaches at least 90% of a predetermined value so that the outer diameter of the crystal 7 reaches the predetermined value and the crystal 7 is defined as a head crystal 71, and vertically growing the head crystal 71 toward an inner bottom 33 surface of the crucible 3. That is to say, in the present embodiment, the crystal 7 is pulled upward to form the neck and the crown, after a solidification speed between the solid-liquid interface M2 of the silicon melt M and the crystal 7 is stabilized, the crystal will neither be pulled nor grown horizontally, and the head crystal 71 vertically grows downward only through adjusting the heating module 4 and controlling a cooling speed of the crucible 3.

It should be noted that in the shoulder-forming step S130, the heat output of the first heating unit 41 is preferably from 150% to 230% of the heat output of the second heating unit 42.

As shown in FIG. 5D to FIG. 5F, the body-forming step S140 is implemented by reducing a total heat output of the heating module 4 so that the head crystal 71 continuously crystallizes to form a first stage crystal 72, continuously reducing the total heat output of the heating module 4 so that the first stage crystal 72 continuously crystallizes to form a second stage crystal 73, and reducing the total heat output of the heating module 4 again so that the second stage crystal 73 continuously crystallizes to form a third stage crystal 74.

That is to say, after forming the neck and the crown, a diameter of the head crystal 71 is maintained at the predetermined value by continuously adjusting the pulling speed and the temperature, and a multi-staged crystal formed by crystallizing for many times as mentioned above is called a crystal body.

According to the body-forming step S140 in the present embodiment, the total heat output of the heating module 4 when forming the first stage crystal 72 is from 93% to 97% the total heat output of the heating module 4 in the shoulder-forming process. In addition, when forming the first stage crystal 72, the heat output of the first heating unit 41 is from 170% to 240% of the heat output of the second heating unit 42, and the heat output of the second heating unit 42 is from 180% to 220% of the heat output of the third heating unit 43.

According to the body-forming step S140 in the present embodiment, the total heat output of the heating module 4 when forming the second stage crystal 73 is from 93% to 97% the total heat output of the heating module 4 when forming the first stage crystal 72. In addition, when forming the second stage crystal 73, the heat output of the first heating unit 41 is from 170% to 240% of the heat output of the second heating unit 42, and the heat output of the second heating unit 42 is from 180% to 220% of the heat output of the third heating unit 43.

The total heat output of the heating module 4 when forming the third stage crystal 74 is from 93% to 97% of the heat output of the heating module 4 when forming the second stage crystal 73. In addition, when forming the third stage crystal 74, the heat output of the first heating unit 41 is from 180% to 260% of the heat output of the second heating unit 42, and the heat output of the second heating unit 42 is from 180% to 220% of the heat output of the third heating unit 43.

According to the body-forming step S140 in the present embodiment, the heat output of the first heating unit 41 is higher than the heat output of the second heating unit 42, and the heat output of the second heating unit 42 is higher than the heat output of the third heating unit 43. Moreover, each of a volume of the first stage crystal 72, a volume of the second stage crystal 73, and a volume of the third stage crystal 74 is from 23% to 32% of a volume of the mono-crystalline silicon ingot 8.

It should be noted that in the body-forming step S140 of the present embodiment, the mono-crystalline silicon growth apparatus 100 preferably receives the heat through injecting the fluid into the hard shaft 53 so that the crystal 7 grows in the crucible 3.

The tail-forming step S150 is implemented by reducing the total heat output of the heating module 4 so that the third stage crystal 74 continuously crystallizes to form a tail crystal 75, and detaching the tail crystal 75 from the crucible 3 to form a mono-crystalline silicon ingot 8 (as shown in FIG. 3) by solidifying the silicon melt M. An outer diameter of the mono-crystalline silicon ingot 8 is substantially 90% of an inner diameter of the crucible 3.

According to the tail-forming step S150 in the present embodiment, a sum of a volume of the head crystal 71 and a volume of the tail crystal 75 is less than or equal to 30% of the volume of the mono-crystalline silicon ingot 8.

According to the tail-forming step S150 in the present embodiment, the total heat output of the heating module 4 when forming the tail crystal 75 is from 93% to 97% of the total heat output of the heating module 4 when forming the third stage crystal 74. In addition, when forming the tail crystal 75, the heat output of the first heating unit 41 is from 80% to 120% of the heat output of the second heating unit 42, and the heat output of the second heating unit 42 is from 180% to 220% of the heat output of the third heating unit 43.

According to the tail-forming step S150 in the present embodiment, after detaching the tail crystal 75 from the crucible 3 in a crystal solidifying process, an inner stress of the crystal 7 is reduced as a result of continuously preserving heat, and the mono-crystalline silicon crystal ingot 8 is therefore formed by solidifying the silicon melt M. The mono-crystalline silicon crystal ingot 8 is then slowly cooled down and taken out of the furnace 1 so that the mono-crystalline silicon crystal ingot 8 has better growth.

It should be noted that, when implementing the mono-crystalline silicon growth method to form the crystal 7, the liquid surface M1 (or an interface between the crystal 7 and the silicon melt M) of the silicon melt M is concave because the temperature gradient is small such that a stress when the crystal 7 grows is small, and the quality of the crystal 7 is further increased.

Therefore, referring to FIG. 1 to FIG. 5F, the mono-crystalline silicon growth apparatus 100 can be used to implement the mono-crystalline silicon growth method shown in FIG. 4 to FIG. 5F. In the initiation step S120 of the mono-crystalline silicon growth method, when the seed crystal 6 contacts the liquid surface M1 of the silicon melt M to solidify to form the crystal 7, the fluid in the water flow channel 531 and/or the gas flow channel 533 can take away the heat near the clamping portion 532 to prevent the clamping portion 532 from being affected by the heat of the silicon melt M in the crucible 3. The hard shaft 53 can move forth and back in the pulling speed along the axial direction of the tube body 511. The seed crystal 6 at the clamping portion 532 correspondingly moves forth and back in the pulling speed in the crucible 3 so as to effectively control a seeding operation and a seeding effect of the seed crystal 6 at the clamping portion 532.

According to the present embodiment, the temperature of the thermal field around the crucible 3 can be adjusted according to growth requirements of the crystal 7 in the crystallization process. Because the fluid in the water flow channel 531 and/or the gas flow channel 533 can take away the heat and the heating power (or the total heat output) of the heating module 4, an outer wall and the outer bottom surface 32 of the crucible 3 can be appropriately cooled down so that a bottom side of the crystal 7 is maintained in a solid state and the temperature of the crystal 7 in a central region is not affected, which prevents the heat generated by the heating module 4 disposed at an outer periphery of the crucible 3 from over-concentrating at four corners and prevents the crystal 7 growing vertically from sticking to the inner bottom surface 33 of the crucible. Therefore, the crystal 7 can be prevented from internally forming an excessive temperature gradient, the inner stress of the crystal 7 can be effectively controlled so that the growing speed and quality of the crystal 7 growing vertically can be controlled effectively to provide the mono-crystalline silicon ingot 8 with a better growth.

In addition, in the crystallization process, with the co-influence of the heat adjusting function of the fluid in the water flow channel 531 and/or the gas flow channel 533 and the heat preservation function of the heat preservation sheets 52, a horizontal temperature gradient of the silicon melt M in the crucible 3 is small so as to control the horizontal crystallization speed of the crystal 7 to be smaller than the vertical crystallization speed of the crystal 7 and prevent the clamping portion 532 from being partially subcooled.

In conclusion, the mono-crystalline silicon growth method in the present embodiment of the present disclosure uses the support base and the crucible unrotatably disposed in the furnace, takes advantage of the heating module to appropriately adjust the temperature around the crucible, prevents the seed crystal from melting unevenly in the crystallization process of the mono-crystalline silicon ingot, and prevents the crystal from internally forming a temperature gradient that is too large so that the crystal does not stick to the inner bottom surface of the crucible, and the inner stress of the crystal can therefore be controlled. Therefore, the seed crystal goes through the crystal growing process smoothly, and a crystal growing effect of the crystal and the quality of the mono-crystalline silicon ingot are improved. As a result, by using the mono-crystalline silicon growth method, a usage rate of the crystal rod and a production yield are increased.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A mono-crystalline silicon growth method, comprising:
   a preparation step implemented by disposing a silicon melt in a crucible;
   an initiation step implemented by solidifying a liquid surface of the silicon melt to form a crystal and horizontally growing the crystal toward a side wall of the crucible to increase an outer diameter of the crystal;
   a shoulder-forming step implemented by adjusting a thermal field around the crucible when the outer diameter of the crystal reaches at least 90% of a predetermined value so that the outer diameter of the crystal reaches the predetermined value and the crystal is defined as a head crystal, and vertically growing the head crystal toward an inner bottom surface of the crucible;
   a body-forming step implemented by reducing a total heat output of a heating module so that the head crystal continuously crystallizes to form a first stage crystal, continuously reducing the total heat output of the heating module so that the first stage crystal continuously crystallizes to form a second stage crystal, and reducing the total heat output of the heating module again so that the second stage crystal continuously crystallizes to form a third stage crystal; and
   a tail-forming step implemented by reducing the total heat output of the heating module so that the third stage crystal continuously crystallizes to form a tail crystal, and detaching the tail crystal from the crucible to form a mono-crystalline silicon ingot by solidifying the silicon melt,
   wherein the total heat output of the heating module when forming the first stage crystal is from 93% to 97% of the total heat output of the heating module in the shoulder-forming step, the total heat output of the heating module when forming the tail crystal is from 93% to 97% of the total heat output of the heating module when forming the third stage crystal, the total heat output of the heating module when forming the second stage crystal is from 93% to 97% of the total heat output of the heating module when forming the first stage crystal, and the total heat output of the heating module when forming the third stage crystal is from 93% to 97% of the total heat output of the heating module when forming the second stage crystal, and
   wherein each of a volume of the first stage crystal, a volume of the second stage crystal, and a volume of the third stage crystal is from 23% to 32% of a volume of the mono-crystalline silicon ingot.

2. The mono-crystalline silicon growth method according to claim 1, wherein a sum of a volume of the head crystal and a volume of the tail crystal is less than or equal to 30% of a volume of the mono-crystalline silicon ingot.

3. The mono-crystalline silicon growth method according to claim 1, wherein in the preparation step, the heating module includes a first heating unit, a second heating unit, and a third heating unit, the first heating unit surrounds and faces toward an upper half of the crucible, the second heating unit surrounds and faces toward a lower half of the crucible, and the third heating unit is disposed under the crucible; and wherein in the body-forming step, a heat output of the first heating unit is higher than a heat output of the second heating unit, and the heat output of the second heating unit is higher than a heat output of the third heating unit.

4. The mono-crystalline silicon growth method according to claim 3, wherein in a process of forming the first stage crystal, the heat output of the first heating unit is from 170% to 240% of the heat output of the second heating unit, and the heat output of the second heating unit is from 180% to 220% of the heat output of the third heating unit;
   wherein in a process of forming the second stage crystal, the heat output of the first heating unit is from 170% to 240% of the heat output of the second heating unit, and the heat output of the second heating unit is from 180% to 220% of the heat output of the third heating unit; and
   wherein in a process of forming the third stage crystal, the heat output of the first heating unit is from 180% to 260% of the heat output of the second heating unit, and the heat output of the second heating unit is from 180% to 220% of the heat output of the third heating unit.

5. The mono-crystalline silicon growth method according to claim 3, wherein in the initiation step, the heat output of the first heating unit is from 80% to 120% of the heat output of the second heating unit, and the heat output of the second heating unit is from 80% to 120% of the heat output of the third heating unit; wherein in the shoulder-forming step, the heat output of the first heating unit is from 150% to 230% of the heat output of the second heating unit; and wherein in the tail-forming step, the heat output of the first heating unit is from 80% to 120% of the heat output of the second heating unit, and the heat output of the second heating unit is from 180% to 220% of the heat output of the third heating unit.

* * * * *